(12) United States Patent
Ma et al.

(10) Patent No.: US 7,910,446 B2
(45) Date of Patent: Mar. 22, 2011

(54) INTEGRATED SCHEME FOR FORMING INTER-POLY DIELECTRICS FOR NON-VOLATILE MEMORY DEVICES

(75) Inventors: Yi Ma, Santa Clara, CA (US); Shreyas Kher, Campbell, CA (US); Khaled Ahmed, Anaheim, CA (US)

(73) Assignee: Applied Materials, Inc., Santa Clara, CA (US)

( * ) Notice: Subject to any disclaimer, the term of this patent is extended or adjusted under 35 U.S.C. 154(b) by 346 days.

(21) Appl. No.: 12/163,542

(22) Filed: Jun. 27, 2008

(65) Prior Publication Data

US 2009/0020802 A1 Jan. 22, 2009

Related U.S. Application Data

(60) Provisional application No. 60/950,046, filed on Jul. 16, 2007.

(51) Int. Cl.
*H01L 21/336* (2006.01)
(52) U.S. Cl. ......... 438/287; 438/216; 438/261; 438/591
(58) Field of Classification Search .................. 438/216, 438/261, 591, 287
See application file for complete search history.

(56) References Cited

U.S. PATENT DOCUMENTS

| | | | |
|---|---|---|---|
| 6,163,049 A * | 12/2000 | Bui | 257/321 |
| 6,274,902 B1 * | 8/2001 | Kauffman et al. | 257/316 |
| 6,812,517 B2 | 11/2004 | Baker | |
| 6,905,939 B2 | 6/2005 | Yuan et al. | |
| 7,005,714 B2 | 2/2006 | Ozawa et al. | |
| 7,067,871 B2 | 6/2006 | Ozawa | |
| 7,115,469 B1 | 10/2006 | Halliyal et al. | |
| 7,122,415 B2 * | 10/2006 | Jang et al. | 438/201 |
| 7,135,370 B2 | 11/2006 | Baker | |
| 7,154,779 B2 | 12/2006 | Mokhlesi et al. | |
| 7,737,488 B2 * | 6/2010 | Lai et al. | 257/325 |

(Continued)

FOREIGN PATENT DOCUMENTS

| KR | 102002006462 | 8/2002 |
|---|---|---|
| KR | 100663366 B1 | 12/2006 |

OTHER PUBLICATIONS

Floating-gate devices: They are not just for digital memories any more, Hasler, P.;Minch, B.A.; Diorio, C., Circuits and Systems, 1999. ISCAS '99. Proceedings of the 1999 IEEE, *Circuits and Systems, 1999. ISCAS '99. Proceedings of the 1999 IEEE International Symposium on* vol. 2, May 30-Jun. 2, 1999 pp. 388-391. Website: http://ieeexplore.ieee.org.

(Continued)

*Primary Examiner* — Eugene Lee
(74) *Attorney, Agent, or Firm* — Patterson & Sheridan, LLP

(57) ABSTRACT

Electronic devices and methods for forming electronic devices that allow for a reduction in device dimensions while also maintaining or reducing leakage current for non-volatile memory devices are provided. In one embodiment, a method of fabricating a non-volatile memory device is provided. The method comprises depositing a floating gate polysilicon layer on a substrate, forming a silicon oxide layer on the floating gate polysilicon layer, depositing a first silicon oxynitride layer on the silicon oxide layer, depositing a high-k dielectric material layer on the first silicon oxynitride layer, depositing a second silicon oxynitride on the high-k dielectric material, and forming a control gate polysilicon layer on the second silicon oxynitride layer. In one embodiment, the high-k dielectric material layer comprises hafnium silicon oxynitride.

16 Claims, 6 Drawing Sheets

U.S. PATENT DOCUMENTS

| | | |
|---|---|---|
| 2004/0175961 A1 | 9/2004 | Olsen |
| 2005/0092620 A1 | 5/2005 | Mavliev et al. |
| 2005/0260347 A1 | 11/2005 | Narwankar et al. |
| 2006/0019033 A1 | 1/2006 | Muthukrishnan et al. |
| 2006/0024959 A1 | 2/2006 | Li et al. |
| 2006/0062917 A1 | 3/2006 | Muthukrishnan et al. |
| 2006/0178018 A1 | 8/2006 | Olsen |
| 2006/0286774 A1 | 12/2006 | Singh et al. |
| 2006/0292844 A1 | 12/2006 | Olsen |
| 2007/0010103 A1 | 1/2007 | Chua et al. |
| 2007/0082507 A1 | 4/2007 | Iyer et al. |
| 2008/0014759 A1 | 1/2008 | Chua et al. |

OTHER PUBLICATIONS

Notice to File a Response issued Jun. 9, 2010 in Korean Patent Application No. 10-2008-0067426 (APPM/011393 KORS).

* cited by examiner

US 7,910,446 B2

INTEGRATED SCHEME FOR FORMING INTER-POLY DIELECTRICS FOR NON-VOLATILE MEMORY DEVICES

CROSS-REFERENCE TO RELATED APPLICATIONS

This application claims benefit of U.S. provisional patent application Ser. No. 60/950,046, filed Jul. 16, 2007, which is herein incorporated by reference.

BACKGROUND OF THE INVENTION

1. Field of the Invention

Embodiments of the present invention as recited in the claims generally relate to electronic devices, methods for forming electronic devices, and more particularly to electronic devices used as non-volatile memory devices.

2. Description of the Related Art

Flash memory has been widely used as non-volatile memory for a wide range of electronic applications, such as mobile phones, personal digital assistants (PDAs), digital cameras, MP3 players, USB devices, and the like. As flash memory is typically used for portable recording devices to store large amounts of information, a reduction in power consumption and cell sizes, along with increased operational speed, are very desirable.

A flash memory device 100, as depicted in FIG. 1, includes a floating gate electrode 102 for storing electrical charge. The floating gate electrode 102 is located on a tunnel oxide layer 104 which overlies a channel region 106 located between source and drain regions 108. Electrons are transferred to the floating gate electrode 102 through the tunnel dielectric layer 104 overlying the channel region 106. Electron transfer is generally initiated by either hot electron injection or Fowler-Nordheim tunneling. A control gate electrode 110, which overlies and is capacitively coupled to the floating gate electrode 102, applies a voltage potential to the floating gate electrode 102. The floating gate electrode 102 is separated from the control gate electrode 110 by an inter-poly dielectric 112 which generally comprises an oxide-nitride-oxide structure ("ONO"). However, as device dimensions are reduced and the corresponding thickness of the ONO structure is reduced leakage currents through the thinner ONO structure have increased.

Therefore there is a need for a device and methods for forming a device that allow for a reduction in device dimensions while also maintaining or reducing leakage current with high charge carrier mobility for non-volatile memory devices.

SUMMARY OF THE INVENTION

An electronic device and methods for forming an electronic device in an integrated process system are provided. In one embodiment, a method of fabricating a non-volatile memory device is provided. The method comprises depositing a floating gate polysilicon layer (i.e. a polysilicon layer used as a floating gate electrode) on a substrate, forming a silicon oxide layer on the floating gate polysilicon layer, depositing a first silicon oxynitride layer on the silicon oxide layer, depositing a high-k dielectric material layer on the first silicon oxynitride layer, depositing a second silicon oxynitride on the high-k dielectric material, and forming a control gate polysilicon layer (i.e. a polysilicon layer used as a control gate electrode) on the second silicon oxynitride layer. In one embodiment, the high-k dielectric material layer comprises hafnium silicon oxynitride.

In another embodiment a non-volatile memory device is provided. The non-volatile memory device comprises a source region and a drain region disposed on a substrate, a floating gate polysilicon layer disposed over the source and drain regions, a first silicon oxynitride layer disposed over the floating gate, a high-k dielectric disposed over the first silicon oxynitride layer, a second silicon oxynitride layer disposed over the high-k dielectric layer, and a control gate polysilicon layer disposed over the high-k dielectric layer. In one embodiment, the high-K dielectric material comprises hafnium silicon oxynitride.

In yet another embodiment a method of fabricating a non-volatile memory device is provided. The method comprises providing a substrate and depositing a polysilicon layer over the substrate. A silicon oxide layer is deposited over the polysilicon layer. The silicon oxide layer is exposed to nitridation process to form a silicon oxynitride layer. A high-K material is deposited over the substrate. The high-K material is subjected to a post deposition annealing process. The high-K material is exposed to a nitridation process followed by a post nitridation annealing process. A second silicon oxide layer is deposited over the substrate. The substrate is exposed to a nitridation process to form a second silicon oxynitride layer. The substrate is exposed to a post nitridation annealing process. In one embodiment, a second polysilicon layer is deposited over the second silicon oxynitride layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
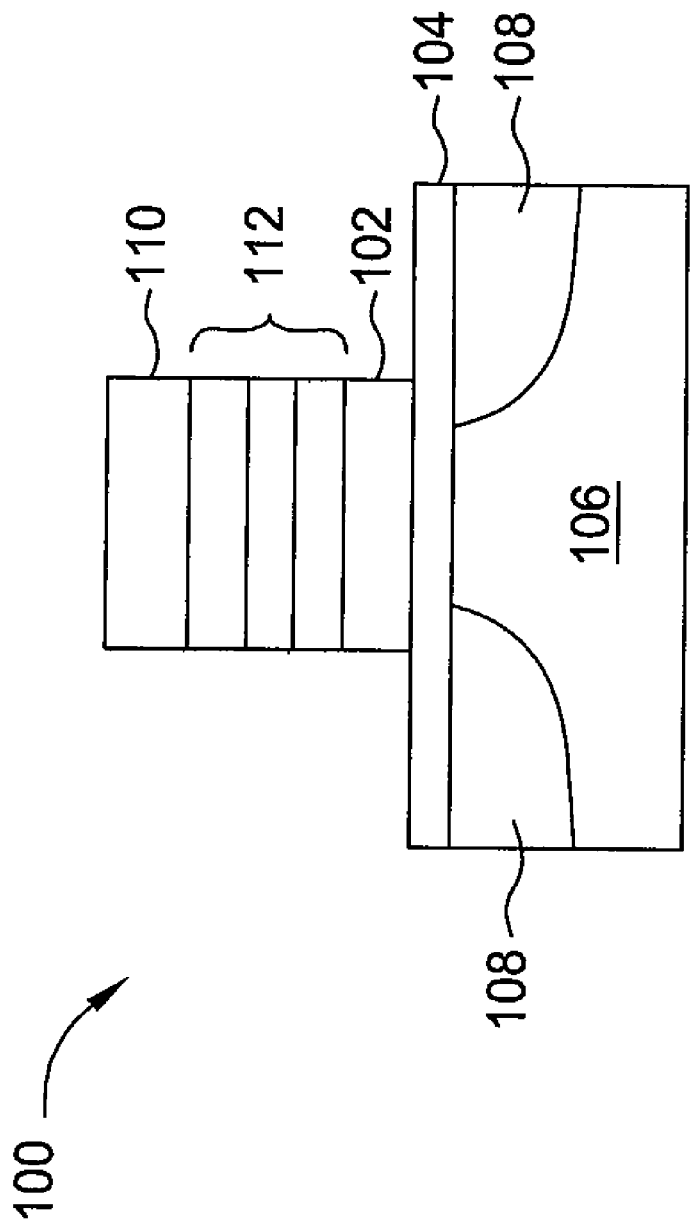
FIG. 1 depicts a two dimensional block diagram of a prior art flash memory cell.

To facilitate understanding, identical reference numerals have been used, where possible, to designate identical elements that are common to the figures. It is contemplated that elements and/or process steps of one or more embodiments may be beneficially incorporated in one or more other embodiments without additional recitation.

DETAILED DESCRIPTION

Embodiments of the invention generally provide a structure and method for forming a structure used in a variety of applications, such as an inter-poly dielectric used in non-volatile memory devices. The improved inter-poly dielectric formed by the present invention may include two silicon oxynitride layers with a high-k layer sandwiched in between.

In some embodiments, the dielectric constant (K) of the high-k dielectric material is greater than 3.9. In other embodiments, the dielectric constant of the high-k dielectric material is in a range from about 4 to about 10. In other embodiments, the dielectric constant is in a range from about 10 to about 100. In other embodiments, the dielectric constant is greater than 100.

Figure 2:
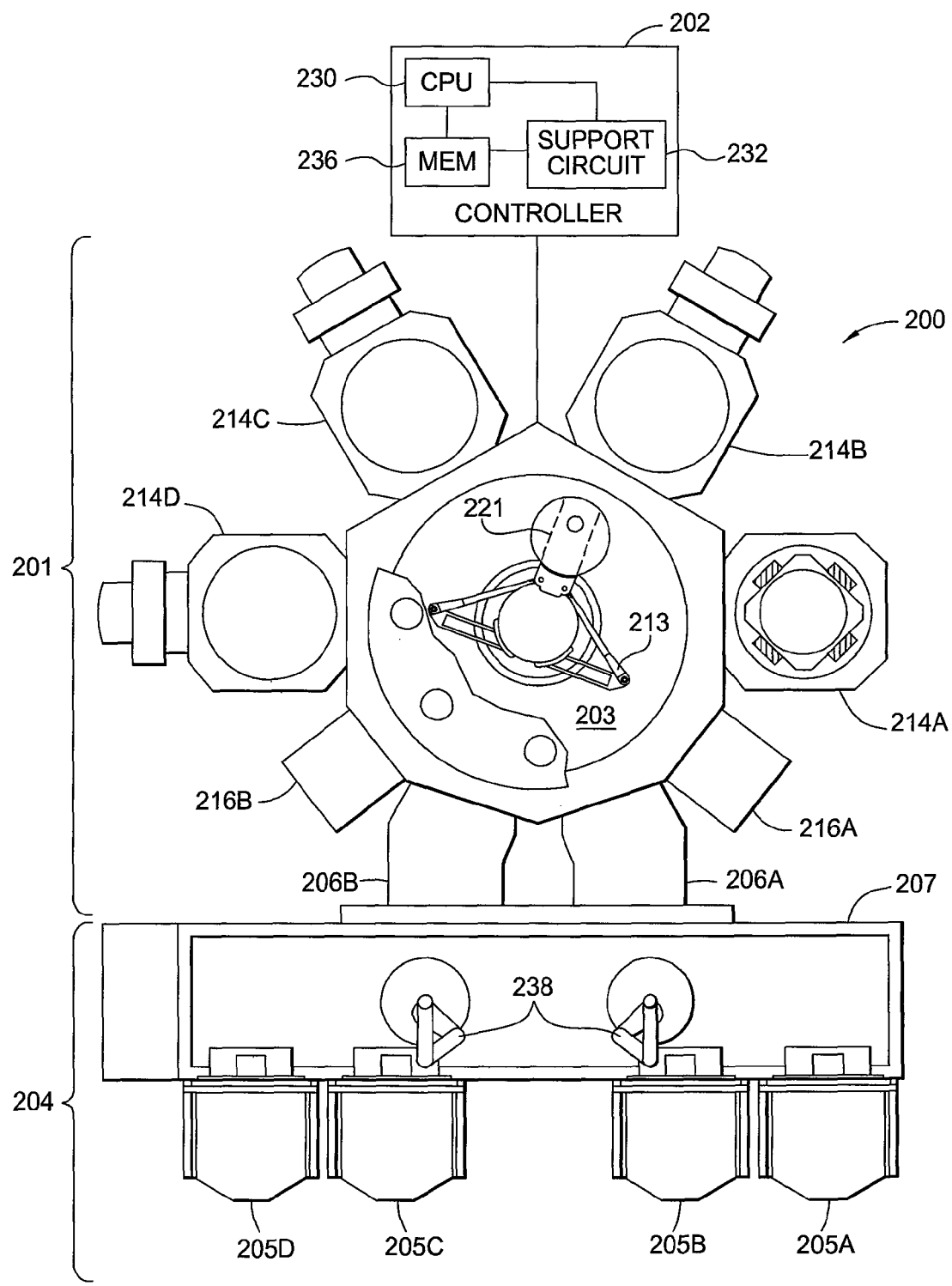
FIG. 2 depicts a schematic plan view of an exemplary integrated semiconductor substrate processing system (e.g. a cluster tool) of the kind used to practice certain embodiments of the present invention.

FIG. 2 depicts a schematic plan view of an exemplary integrated semiconductor substrate processing system 200 of the kind used to practice embodiments of the present invention. Examples of the integrated system 200 include the PRODUCER®, CENTURA® and ENDURA® integrated systems, all available from Applied Materials, Inc., of Santa Clara, Calif. It is contemplated that the methods described herein may be practiced in other systems having the requisite process chambers coupled thereto, including those available from other manufacturers.

The processing system 200 includes a vacuum-tight processing platform 201, a factory interface 204, and a system controller 202. The platform 201 comprises a plurality of processing chambers 214A-D and load-lock chambers 206A-B, which are coupled to a vacuum substrate transfer chamber 203. The factory interface 204 is coupled to the transfer chamber 203 by the load lock chambers 206A-B. The processing system 200 includes a vacuum-tight processing platform 201, a factory interface 204, and a system controller 202. The platform 201 comprises a plurality of processing chambers 214A-D and load-lock chambers 206A-B, which are coupled to a vacuum substrate transfer chamber 203. The factory interface 204 is coupled to the transfer chamber 203 by the load lock chambers 206A-B.

In one embodiment, the factory interface 204 comprises at least one docking station 207, at least one factory interface robot 238 to facilitate transfer of substrates. The docking station 207 is configured to accept one or more front opening unified pod (FOUP). Four FOUPS 205A-D are shown in the embodiment of FIG. 1. The factory interface robot 238 is configured to transfer the substrate from the factory interface 204 to the processing platform 201 for processing through the loadlock chambers 206A-B.

Each of the loadlock chambers 206A-B have a first port coupled to the factory interface 204 and a second port coupled to the transfer chamber 203. The loadlock chamber 206A-B are coupled to a pressure control system (not shown) which pumps down and vents the chambers 206A-B to facilitate passing the substrate between the vacuum environment of the transfer chamber 203 and the substantially ambient (e.g., atmospheric) environment of the factory interface 204.

The transfer chamber 203 has a vacuum robot 213 disposed therein. The vacuum robot 213 is capable of transferring substrates 221 between the loadlock chamber 206A-B and the processing chambers 214A-D. In one embodiment, the transfer chamber 203 may include a cool down station built therein to facilitate cooling down the substrate while transferring a substrate in the processing system 200.

In one embodiment, the processing chambers coupled to the transfer chamber 203 may include chemical vapor deposition (CVD) chambers 214A-B, a Decoupled Plasma Nitridation (DPN) chamber 214C, and a Rapid Thermal Process (RTP) chamber 214D. The chemical vapor deposition (CVD) chambers 214A-B may include different types of chemical vapor deposition (CVD) chambers, such as a thermal chemical vapor deposition (Thermal-CVD) process, low pressure chemical vapor deposition (LPCVD), metal-organic chemical vapor deposition (MOCVD), plasma enhanced chemical vapor deposition (PECVD), sub-atmosphere chemical vapor deposition (SACVD) and the like. Alternatively, different processing chambers, including at least one ALD, CVD, PVD, DPN, or RTP chamber, may be interchangeably incorporated into the integrated processing system 200 in accordance with process requirements. Suitable ALD, CVD, PVD, DPN, RTP, and MOCVD processing chambers are available from Applied Materials, Inc., among other manufacturers.

In one embodiment, an optional service chamber (shown as 216A-B) may be coupled to the transfer chamber 203. The service chambers 216A-B may be configured to perform other substrate processes, such as degassing, orientation, precleaning process, cool down, and the like.

The system controller 202 is coupled to the integrated processing system 200. The system controller 202 controls the operation of the processing system 200 using a direct control of the process chambers 214A-D of the processing system 200 or alternatively, by controlling the computers (or controllers) associated with the process chambers 214A-D and processing system 200. The system controller 202 may comprise a CPU 230, a memory storage device 236, and a support circuit 232. In operation, the system controller 202 enables data collection and feedback from the respective chambers and system to optimize performance of the processing system 200.

Figure 3:
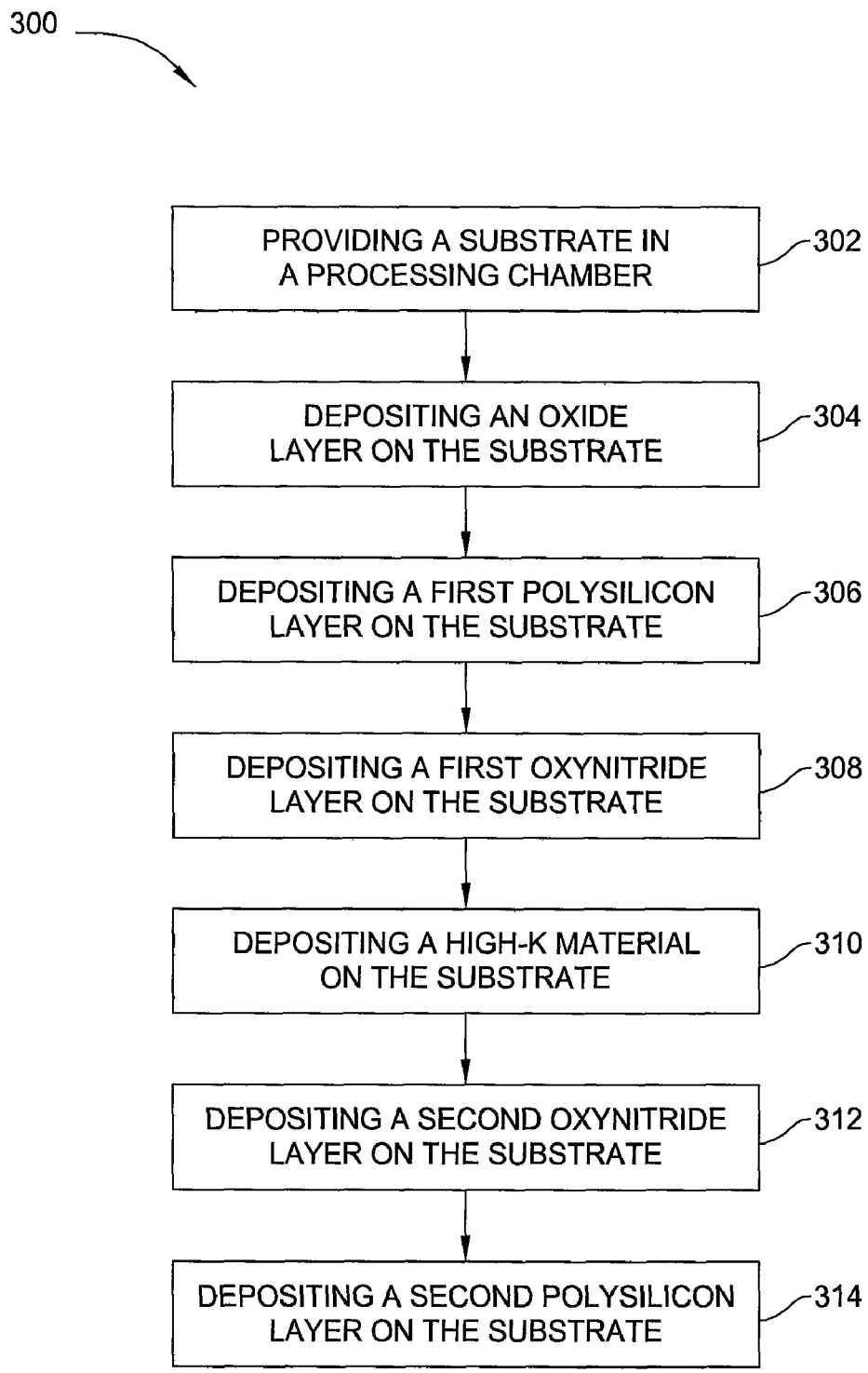
FIG. 3 depicts a process flow diagram of a deposition process according to one embodiment of the present invention.
Figure 4A:
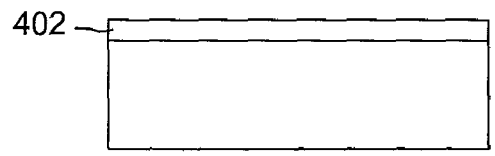
FIG. 4A-4G depicts schematic cross-sectional views of a substrate structure in accordance with one embodiment of the present invention.
Figure 4B:
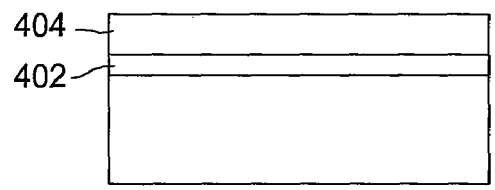
Figure 4C:
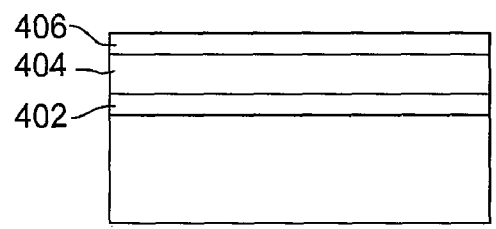
Figure 4D:
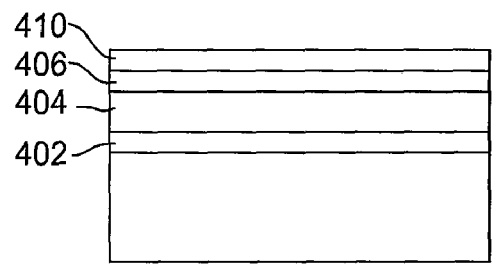
Figure 4E:
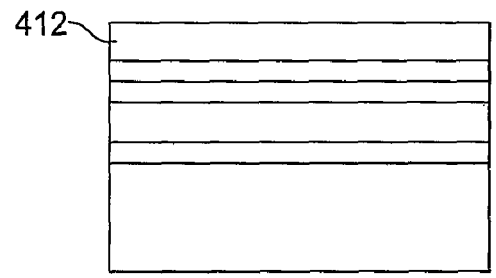
Figure 4F:
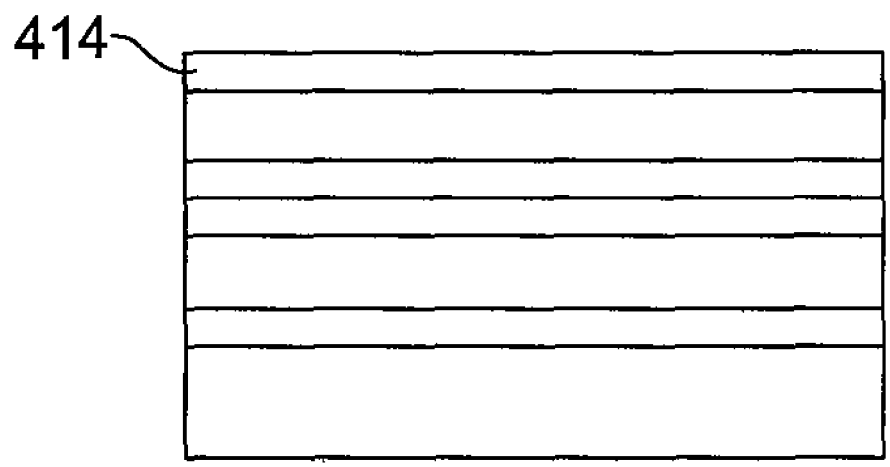
Figure 4G:
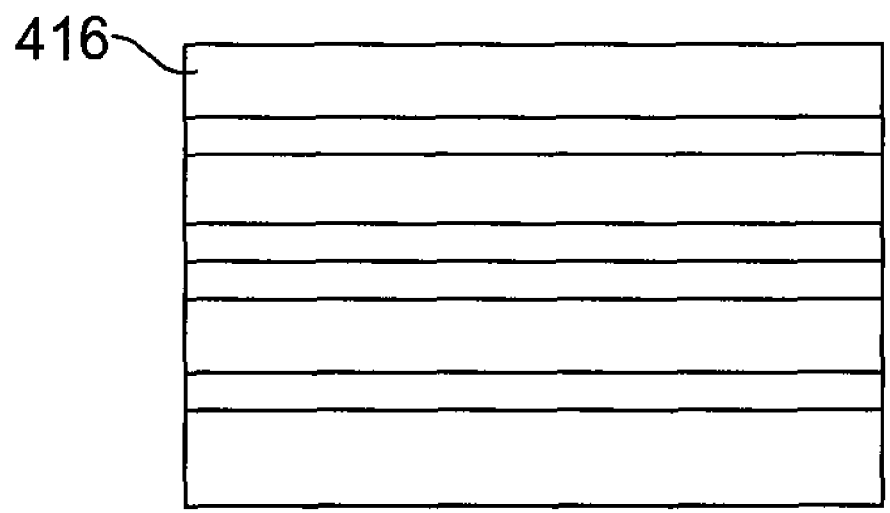

FIG. 3 depicts a process flow diagram of a deposition process 300 according to one embodiment of the present invention. It is also contemplated that the process 300 may be performed in other systems, including those from other manufacturers. FIGS. 4A-4G depict schematic cross-sectional views of a substrate structure in accordance with one embodiment of the present invention.

The process 300 begins at box 302 by providing a substrate 221 to a processing chamber, such as processing chamber 214A integrated into the system 200 described above. The substrate 221 refers to any substrate or material surface upon which film processing is performed. For example, the substrate 221 may be a material such as crystalline silicon (e.g., Si<100> or Si<111>), silicon oxide, strained silicon, silicon germanium, doped or undoped polysilicon, doped or undoped silicon wafers and patterned or non-patterned wafers, silicon on insulator (SOI), carbon doped silicon oxides, silicon nitride, doped silicon, germanium, gallium arsenide, glass, sapphire or other suitable workpieces. The substrate 221 may have various dimensions, such as 200 mm, 300 mm diameter, or 450 mm wafers, as well as, rectangular or square panels. Unless otherwise noted, embodiments and examples described herein are conducted on substrates with a 200 mm diameter, a 300 mm diameter, or a 450 mm diameter. In one embodiment, the substrate 221 may include an inter-poly dielectric film stack disposed thereon including a high-k material that may be suitable for non-volatile flash memory devices.

At box 304, an oxide layer is grown on the substrate 221. The dielectric film stack disposed on the substrate 221 includes a gate oxide layer 402 disposed on the substrate 221. The gate oxide layer 402 may be deposited by any suitable process. In one embodiment, the gate oxide layer is grown using a RTP process. The gate oxide layer functions as a tunnel dielectric. In one embodiment, the gate oxide layer 402 comprises silicon dioxide. In one embodiment, the gate oxide layer contains a trace amount of nitrogen.

Prior to transferring the substrate 221 into the processing chamber 214A, a precleaning process may be performed to clean the substrate 221. The precleaning process is configured to cause compounds that are exposed on the surface of the substrate 221 to terminate in a functional group. Functional groups attached and/or formed on the surface of the substrate 221 include hydroxyls (OH), alkoxy (OR, where R=Me, Et, Pr or Bu), haloxyls (OX, where X=F, Cl, Br or I), halides (F, Cl, Br or I), oxygen radicals and aminos (NR or $NR_2$, where R=H, Me, Et, Pr or Bu). The precleaning process may expose the surface of the substrate 221 to a reagent, such as $NH_3$, $B_2H_6$, $SiH_4$, $Si_2H_6$, $H_2O$, HF, HCl, $O_2$, $O_3$, $H_2O$, $H_2O_2$, $H_2$, atomic-H, atomic-N, atomic-O, alcohols, amines, plasmas thereof, derivatives thereof or combinations thereof. The functional groups may provide a base for an incoming chemical precursor to attach on the surface of the substrate 221. In one embodiment, the precleaning process may expose the surface of the substrate 221 to a reagent for a period from about 1 second to about 2 minutes. In one embodiment, the exposure period may be from about 5 seconds to about 60 seconds. Precleaning processes may also include exposing the surface of the substrate 221 to an RCA solution (SC1/SC2), an HF-last solution, peroxide solutions, acidic solutions, basic solutions, plasmas thereof, derivatives thereof or combinations thereof. Useful precleaning processes are described in commonly assigned U.S. Pat. No. 6,858,547 and U.S. patent application Ser. No. 10/302,752, filed Nov. 21, 2002, entitled, "Surface Pre-Treatment for Enhancement of Nucleation of High Dielectric Constant Materials," and published as US 2003/0232501, which are both incorporated herein by reference in their entirety.

In one embodiment where a wet-clean process is performed to clean the substrate surface, the wet-clean process may be performed in a TEMPEST™ wet-clean system, available from Applied Materials, Inc. Alternatively, the substrate 221 may be exposed to water vapor derived from a WVG system for about 15 seconds.

At box 306, a first polysilicon layer 404 is deposited on the substrate 221. The first polysilicon layer 404 may be deposited using LPCVD or other suitable processes for depositing a polysilicon layer. The first polysilicon layer 404 may function as a floating gate for storing electrical charge. The first polysilicon layer 404 is generally deposited with a film thickness in a range from about 50 nm to about 400 nm, preferably from about 100 nm to about 300 nm, and more preferably from about 150 nm to about 200 nm. The first polysilicon layer 404 may be deposited at a temperature of about 720° C. and a pressure of about 275 Torr.

Optionally, a second oxide layer 406 is formed on the substrate 221 using rapid thermal oxidation techniques. In one embodiment, the second oxide layer 406 comprises a $SiO_2$ film grown using a reduced pressure RTP chamber such as the RTP chamber 216 of the integrated processing system 200 (FIG. 2). The $SiO_2$ film is formed by a rapid thermal oxidation of the polysilicon layer 404, which is an oxidation process where the chamber uses lamps to quickly heat and dry a substrate surface to form an oxidized layer in the presence of oxygen. The rapid thermal oxidation of a silicon substrate (or a wafer) is carried out using a dry process rapid thermal oxidation with the presence Of $O_2$, $O_2+N_2$, $O_2+Ar$, $N_2O$, or $N_2O+N_2$ gas mixtures. The gas or gas mixtures can have a total flow rate of about 1-5 slm. Alternatively, the rapid thermal oxidation of a silicon substrate is carried out using a wet process such as In-Situ Steam Generation (ISSG) with the presence of $O_2+H_2$, $O_2+H_2+N_2$, or $N_2O+H_2$ having, for example, a total flow rate of about 1-5 slm with 1-13% $H_2$. In one embodiment, the rapid thermal oxidation process used to form the $SiO_2$ dielectric film is performed at a processing temperature of about 750-1,000° C. and a processing pressure of about 0.5-50 Torr for about 5-90 seconds which results in a $SiO_2$ dielectric film having a thickness in the range of about 0.4-1.5 nm. The second oxide layer 406 may have a film thickness in a range from about 0.5 nm to about 10 nm, preferably from about 5 nm to about 10 nm, and more preferably from about 7 nm to about 10 nm. In one embodiment, the second oxide layer 406 has a thickness between about 1 nm and about 2 nm.

At box 308, a first silicon oxynitride layer 410 is deposited on substrate 221. The first silicon oxynitride layer 410 is formed by depositing a silicon oxide layer followed by a plasma nitridation step. The silicon oxide layer may be deposited using a Rapid Thermal Process (RTP), conventional chemical vapor deposition (CVD), rapid thermal-CVD (RT-CVD), plasma enhanced-CVD (PE-CVD), physical vapor deposition (PVD), atomic layer deposition (ALD), atomic layer epitaxy or combinations thereof. The first silicon oxynitride layer 410 has a thickness in a range from about 0.5 nm to about 30 nm, preferably from about 1 nm to about 20 nm, and more preferably from about 3 nm to about 8 nm.

In one embodiment, deposition of the silicon oxide layer using LPCVD is achieved by exposing the substrate 221 to an oxygen containing gas such as $N_2O$ at a bottom flow rate from about 1,000 sccm to about 4,000 sccm, for example, about 3,000 sccm, nitrogen gas at a top flow rate from about 1,000 sccm to about 2,000 sccm, for example, about 1,800 sccm, and a silicon containing gas such as $SiH_4$ at a flow rate from about 1 sccm to about 20 sccm, for example, about 4 sccm, at a temperature from about 500° C. to about 1,000° C., for example, about 700° C., a pressure from about 200 Torr to about 1,000 Torr, for example, about 275 Torr. The silicon containing gas may be selected from the group comprising silane ($SiH_4$), disilane ($Si_2H_6$), silicon tetrachloride ($SiCl_4$), dichlorosilane ($Si_2Cl_2H_2$), trichlorosilane ($SiCl_3H$), and combinations thereof. The oxygen-containing gas my be selected from the group comprising atomic oxygen (O), oxygen ($O_2$), nitrous oxide ($N_2O$), nitric oxide (NO), nitrogen dioxide ($NO_2$), dinitrogen pentoxide ($N_2O_5$), plasmas thereof, radicals thereof, derivatives thereof, or combinations thereof.

In one embodiment, the silicon oxide material may be formed by exposing the substrate to at least one deposition gas during the deposition process. In one embodiment, the deposition process is a CVD process having a deposition gas that may contain a silicon precursor and an oxygen precursor or a precursor containing both silicon and oxygen sources. Alternatively, the deposition process may be an ALD process having at least two deposition gases, such that, the substrate is sequentially exposed to a silicon precursor and an oxygen precursor.

Examples of suitable oxygen precursors for forming silicon oxide materials during box 308 include atomic oxygen (O), oxygen ($O_2$), ozone ($O_3$), water ($H_2O$), hydrogen peroxide ($H_2O_2$), organic peroxides, alcohols, nitrous oxide ($N_2O$), nitric oxide (NO), nitrogen dioxide ($NO_2$), dinitrogen pentoxide ($N_2O_5$), plasmas thereof, radicals thereof, derivatives thereof, or combinations thereof. In one embodiment, an oxygen precursor may be formed by combining ozone and water to provide a strong oxidizing agent. The oxygen precursor generally contains hydroxyl radicals (OH) which have strong oxidizing power. The ozone concentration may vary relative to the water concentration. A molar ratio of ozone to water ratio may be within a range from about 0.01 to about 30, preferably, from about 0.03 to about 3, and more preferably, from about 0.1 to about 1.

Examples of suitable silicon precursors for forming silicon oxide materials during box 308 include silanes, alkylsilanes, halosilanes, alkoxysilanes, aminosilanes, aminodisilanes, silylazides, silylhydrazines, or derivatives thereof. Some specific examples of silicon precursors include silane ($SiH_4$), disilane ($Si_2H_6$), trisilane ($Si_3H_8$), methylsilane ($CH_3SiH_3$), bis(tertbutylamino)silane (BTBAS or ($^tBu(H)N)_2SiH_2$), tetraethoxysilane (($EtO)_4Si$ or TEOS), hexachlorodisilane (HCD or $Si_2Cl_6$), tetrachlorosilane ($SiCl_4$), dichlorosilane ($H_2SiCl_2$), 1,2-diethyl-tetrakis(diethylamino) disilane (($CH_2CH_3((CH_3CH_2)_2N)_2Si)_2$), 1,2-dichloro-tetrakis(diethylamino) disilane (($Cl((CH_3CH_2)_2N)_2Si)_2$), hexakis(N-pyrrolidinio) disilane ((($C_4H_9N)_3)Si)_2$), 1,1,2,2-tetrachloro-bis(di(trimethyl silyl)amino) disilane, (($Cl_2((CH_3)_3Si)_2N)Si)_2$), 1,1,2,2-tetrachloro-bis(diisopropylamino) disilane, (($Cl_2((C_3H_7)_2N)Si)_2$), 1,2-dimethyltetrakis(diethylamino) disilane (($CH_3(CH_3CH_2N)_2Si)_2$), tris(dimethylamino)silane azide ((($CH_3)_2N)_3SiN_3$), tris(methylamino)silane azide ((($CH_3)(H)N)_3SiN_3$), 2,2-dimethylhydrazine-dimethylsilane (($CH_3)_2(H)Si)(H)NN(CH_3)_2$), trisilylamine (($SiH_3)_3N$ or TSA), and hexakis(ethylamino)disilane ((($EtHN)_3Si)_2$), radicals thereof, plasmas thereof, derivatives thereof, or combinations thereof.

In one embodiment, an alkoxysilane compound is used as the silicon precursor for forming silicon oxide materials during box 308. The alkoxysilane may have the chemical formula $(RO)_nSiR'_{(4-n)}$, wherein n=1, 2, 3, or 4, each R, independently, may be methyl, ethyl, propyl, butyl, or other alkyl group, and each R', independently, may be hydrogen, a halogen group, methyl, ethyl, propyl, butyl, or other alkyl group. Examples of alkoxysilane compounds that may be used as silicon precursors include tetraethoxysilane (($EtO)_4Si$ or TEOS), tetramethoxysilane (($MeO)_4Si$), tetrapropoxysilane (($PrO)_4Si$), tetraisopropoxysilane (($^iPrO)_4Si$), tetrabutoxysilane (($BuO)_4Si$), triethoxysilane (($EtO)_3SiH$), diethoxysilane (($EtO)_2SiH_2$), diethoxydimethylsilane (($EtO)_2SiMe_2$), diethoxydiethylsilane (($EtO)_2SiEt_2$), dimethoxydiethoxsilane (($MeO)_2Si(OEt)_2$), derivatives thereof, or combinations thereof. In another embodiment, an alkoxysilane compound (e.g., TEOS) may be used as a source for both silicon and oxygen, instead of separate silicon and oxygen precursors, to form a silicon oxide material during step 308.

In one embodiment, at box 308, the oxygen precursor and the silicon precursor may be introduced into process chamber simultaneously, such as during a traditional CVD process or sequentially, such as during an ALD process. The ALD process may expose the substrate 221 to at least two deposition gases, such that, the substrate is sequentially exposed to a silicon precursor and an oxygen precursor.

A description of CVD and ALD processes and apparatuses that may be modified (e.g., incorporating a UV radiation source) and chemical precursors that may be useful for depositing silicon oxide materials are further disclosed in commonly assigned U.S. Pat. Nos. 6,869,838, 6,825,134, 6,905, 939, and 6,924,191, and commonly assigned U.S. Ser. No. 09/964,075, filed Sep. 25, 2001, and published as US 2003-0059535, U.S. Ser. No. 10/624,763, filed Jul. 21, 2003, and published as US 2004-0018738, U.S. Ser. No. 10/794,707, filed Mar. 4, 2004, and published as US 2004-0175961, and U.S. Ser. No. 10/688,797, filed Oct. 17, 2003, and published as US 2004-0224089, which are all herein incorporated by reference in their entirety.

As the silicon precursor and the oxygen precursor may be combined in the process chamber, a silicon-containing material, such as a silicon oxide material, is formed on the substrate surface. In one embodiment, the silicon oxide material may be deposited at a rate within a range from about 10 Å/min to about 500 Å/min and is deposited to a thickness within a range from about 10 Å to about 1,000 Å. Silicon oxide materials may have a chemical formula such as $Si_xO_y$, wherein an oxygen:silicon atomic ratio (Y/X) is about 2 or less, for example, $SiO_2$. In one embodiment, the materials formed as described herein exhibits low hydrogen concentration and includes a small amount of carbon doping, which enhances boron retention in PMOS devices. In one embodiment, a halogen-free silicon precursor improves the wet etch rate.

A carrier gas may be provided during box 308 to control the partial pressure of the oxygen precursor and the silicon precursor. The total internal pressure of a single wafer process chamber may be at a pressure within a range from about 100 mTorr to about 740 Torr, preferably, from about 250 mTorr to about 400 Torr, and more preferably, from about 500 mTorr to about 200 Torr. In one example, the internal pressure of the process chamber is maintained at a pressure of about 150 Torr or less, preferably, about 100 Torr or less, and more preferably, about 50 Torr or less. In some embodiments, the carrier gas may be provided to control the partial pressure of the nitrogen precursor or the silicon precursor within a range from about 100 mTorr to about 1 Torr for batch processing systems. Examples of suitable carrier gases include nitrogen, hydrogen, argon, helium, forming gas, or combinations thereof.

In one embodiment, deposition of the silicon oxide layer using LPCVD is achieved by exposing the substrate 221 to an oxygen containing gas such as $N_2O$ at a flow rate from between about 500 sccm to about 5,000 sccm, such as between about 1,000 sccm to about 4,000 sccm, for example, about 3,000 sccm, nitrogen containing gas at a flow rate from about 1,000 sccm to about 15,000 sccm, for example, about 10,000 sccm, and a silicon containing gas such as $SiH_4$ at a flow rate from about 1 sccm to about 50 sccm, such as between about 1 sccm to about 20 sccm, for example, about 4 sccm, at a temperature from about 500° C. to about 1,000° C., such as between 500° C. and about 800° C., for example, about 700° C., a pressure from about 10 Torr to about 1,000 Torr, for example, about 140 Torr. In one embodiment, the pressure is between about 1 Torr and about 760 Torr, for example, about 275 Torr, for a time period from about 1 second to about 120 seconds, for example, about 39 seconds. The silicon oxide layer is generally deposited with a film thickness from about 10 Å to about 200 Å, preferably from about 30 Å to about 150 Å and more preferably from about 50 Å to about 100 Å, for example, about 80 Å. The silicon containing gas may be selected from the group comprising silane ($SiH_4$), disilane ($Si_2H_6$), silicon tetrachloride ($SiCl_4$), dichlorosilane ($Si_2Cl_2H_2$), trichlorosilane ($SiCl_3H$), and combinations thereof. The oxygen-containing gas my be selected from the group comprising atomic oxygen (O), oxygen ($O_2$), nitrous oxide ($N_2O$), nitric oxide (NO), nitrogen dioxide ($NO_2$), dinitrogen pentoxide ($N_2O_5$), plasmas thereof, radicals thereof, derivatives thereof, or combinations thereof.

In one embodiment, after the $SiO_2$ film is formed in the LPCVD chamber 214A, the substrate 221 is transferred to the DPN chamber 214C of the integrated processing system 200 under an inert (e.g., $N_2$ or Ar) environment with the transfer chamber pressure being approximately the same pressure for the plasma nitridation process. The plasma nitridation process exposes the $SiO_2$ film to nitrogen plasma and incorporates nitrogen into the $SiO_2$ film to form a silicon oxynitride film. In one embodiment, the DPN chamber 214C is a reduced pressure inductively coupled RF plasma reactor that can accommodate an inert gas such as $N_2$, He, or Ar. Process conditions are set to incorporate, for example between about 10 atomic % and about 20 atomic % nitrogen into the $SiO_2$ film.

In one embodiment the substrate 221 is transferred to an anneal chamber 214D, such as the XE, XE Plus, or RADIANCE™ rapid thermal processing (RTP) chamber available from Applied Materials, Inc., located in Santa Clara, Calif., for a post nitridation annealing of the silicon oxynitride layer 410 in an oxygen containing atmosphere. A post nitridation anneal is performed where the substrate is annealed at a temperature from about 500° C. to about 1,200° C., preferably from about 900-1,100° C. for a time period from about 1 second to about 240 seconds, preferably from about 30 seconds to about 90 seconds, for example, at about 1,000° C. for about 60 seconds. Generally, the anneal chamber atmosphere contains at least one anneal gas, such as $O_2$, $N_2$, $NH_3$, $N_2H_4$, NO, $N_2O$, or combinations thereof. The anneal chamber is maintained at a pressure from about 5 Torr to about 100 Torr, for example, at about 50 Torr.

At box 310, a high-K dielectric layer 412 is deposited on the first silicon oxynitride layer 410 by a vapor deposition process, such as ALD, CVD, PVD, thermal techniques or combinations thereof. In one embodiment, the high-K dielectric layer may be deposited by ALD processes and apparatuses as described in commonly assigned and co-pending U.S. patent application Ser. Nos. 11/127,767 and 11/127,753, both filed May 12, 2005, and both entitled, "Apparatuses and Methods for Atomic Layer Deposition of Hafnium-containing High-K Materials," which are incorporated herein by reference in their entirety for the purpose of describing methods and apparatuses used during ALD processes. The high-K dielectric layer 412 is generally deposited with a film thickness in a range from about 0.5 nm to about 30 nm, preferably from about 1 nm to about 20 nm, and more preferably from about 1 nm to about 8 nm.

The high-K dielectric layer 412 is deposited on the substrate surface and may have a variety of compositions that are homogenous, heterogeneous, graded and/or multiple layered stacks or laminates. The high-K dielectric layer 412 is generally a high-k dielectric material and may include combinations of hafnium, zirconium, titanium, tantalum, lanthanum, aluminum, silicon, oxygen and/or nitrogen. The high-K dielectric layer 412 may have a composition that includes hafnium-containing materials, such as hafnium oxides ($HfO_x$ or $HfO_2$), hafnium silicates ($HfSi_xO_y$ or $HfSiO_4$), hafnium silicon oxynitrides ($HfSi_xO_yN_z$), hafnium oxynitrides ($HfO_xN_y$), hafnium aluminates ($HfAl_xO_y$), hafnium aluminum silicates ($HfAl_xSi_yO_z$), hafnium aluminum silicon oxynitrides ($HfAl_wSi_xO_yN_z$), hafnium lanthanum oxides ($HfLa_xO_y$), zirconium-containing materials, such as zirconium oxides ($ZrO_x$ or $ZrO_2$), zirconium silicates ($ZrSi_xO_y$ or $ZrSiO_4$), zirconium silicon oxynitrides ($ZrSi_xO_yN_z$), zirconium oxynitrides ($ZrO_xN_y$), zirconium aluminates ($ZrAl_xO_y$), zirconium aluminum silicates ($ZrAl_xSi_yO_z$), zirconium aluminum silicon oxynitrides ($ZrAl_wSi_xO_yN_z$), zirconium lanthanum oxides ($ZrLa_xO_y$), other aluminum-containing materials or lanthanum-containing materials, such as aluminum oxides ($Al_2O_3$ or $AlO_x$), aluminum oxynitrides ($AlO_xN_y$), aluminum silicates ($AlSi_xO_y$), aluminum silicon oxynitrides ($AlSi_xO_yN_z$), lanthanum aluminum oxides ($LaAl_xO_y$), lanthanum oxides ($LaO_x$ or $La_2O_3$), derivatives thereof and combinations thereof. Other dielectric materials useful for high-K dielectric layer 412 may include titanium oxides ($TiO_x$ or $TiO_2$), titanium oxynitrides ($TiO_xN_y$), tantalum oxides ($TaO_x$ or $Ta_2O_5$) and tantalum oxynitrides ($TaO_xN_y$). Laminate films that are useful dielectric materials for high-K dielectric layer 412 include $HfO_2/Al_2O_3$, $HfO_2/SiO_2$, $La_2O_3/Al_2O_3$ and $HfO_2/SiO_2/Al_2O_3$.

In one embodiment, the ALD process is conducted in a process chamber, for example, processing chamber 214B, at a pressure in the range from about 1 Torr to about 100 Torr, preferably from about 1 Torr to about 20 Torr, and more preferably in a range from about 3 Torr to about 4 Torr. The temperature of the substrate is usually maintained in the range from about 70° C. to about 1,000° C., preferably from about 100° C. to about 750° C., and more preferably from about 550° C. to about 700° C. In one embodiment, a hafnium precursor is introduced into the process chamber at a rate in the range from about 5 mg/min to about 20 mg/min. The hafnium precursor is usually introduced with a carrier gas, such as nitrogen, with a total flow rate in the range from about 50 sccm to about 1,000 sccm. The hafnium precursor may be pulsed into the process chamber at a rate in a range from about 0.1 seconds to about 10 seconds, depending on the particular process conditions, hafnium precursor or desired composition of the deposited hafnium-containing material. In one embodiment, the hafnium precursor is pulsed into the process chamber at a rate in a range from about 1 second to about 5 seconds, for example, about 3 seconds.

In one embodiment, the hafnium precursor is pulsed into the process chamber at a rate in a range from about 0.1 seconds to about 1 second, for example, about 0.5 seconds. In one example, the hafnium precursor is preferably TDEAH, the silicon precursor (Tris-DMAS), and in-situ water vapor produced by a water vapor generator (WVG) system, available from Fujikin of America, Inc., located in Santa Clara, Calif. The ALD cycle includes co-flowing TDEAH and Tris-DMAS in a first half reaction and sequentially pulsing water vapor in a second half reaction, with each half reaction separated by an argon purge. The hafnium silicate layer is formed by repeating the cycle ten times until the film has a thickness of about 4 Å.

The pulses of a purge gas, preferably argon or nitrogen, are typically introduced at a flow rate in a range from about 2 standard liters per minute (slm) to about 22 slm, preferably about 10 slm. Each processing cycle occurs for a time period in a range from about 0.01 seconds to about 20 seconds. In one embodiment, the process cycle lasts about 10 seconds. In another embodiment, the process cycle lasts about 2 seconds. Longer processing steps lasting about 10 seconds deposit excellent hafnium-containing films, but reduce the throughput. The specific purge gas flow rates and duration of process cycles are obtained through experimentation. In one embodiment, a 300 mm diameter wafer requires about twice the flow rate for the same duration as a 200 mm diameter wafer in order to maintain similar throughput. An oxidizing gas is introduced to the process chamber with a flow rate in the range from about 0.05 sccm to about 1,000 sccm, preferably in the range from about 0.5 sccm to about 100 sccm. The oxidizing gas is pulsed into process chamber at a rate in a range from about 0.05 seconds to about 10 seconds, preferably, from about 0.08 seconds to about 3 seconds, and more preferably, from about 0.1 seconds to about 2 seconds. In one embodiment, the oxidizing gas is pulsed at a rate in a range from about 1 second to about 5 seconds, for example, about 1.7 seconds. In another embodiment, the oxidizing gas is pulsed at a rate in a range from about 0.1 seconds to about 3 seconds, for example, about 0.5 seconds.

In one embodiment, substrate 221 may be optionally exposed to a post deposition anneal (PDA) process. Substrate 221 containing high-K dielectric layer 412 is transferred to the annealing chamber 214D, such as the CENTURA™ RADIANCE™ RTP chamber available from Applied Materials, Inc., located in Santa Clara, Calif. and exposed to the PDA process. Substrate 221 may be heated to a temperature within a range from about 600° C. to about 1,200° C., preferably from about 600° C. to about 1,150° C., and more preferably from about 600° C. to about 1,000° C. The PDA process may last for a time period within a range from about 1 second to about 5 minutes, preferably, from about 1 minute to about 4 minutes, and more preferably from about 2 minutes to about 3 minutes. Generally, the chamber atmosphere contains at least one annealing gas, such as oxygen ($O_2$), ozone ($O_3$), atomic oxygen (O), water ($H_2O$), nitric oxide (NO), nitrous oxide ($N_2O$), nitrogen dioxide ($NO_2$), dinitrogen pentoxide ($N_2O_5$), nitrogen ($N_2$), ammonia ($NH_3$), hydrazine ($N_2H_4$), derivatives thereof or combinations thereof. Often the annealing gas contains nitrogen and at least one oxygen-containing gas, such as oxygen. The chamber may have a pressure within a range from about 5 Torr to about 100 Torr, for example, about 10 Torr. In one example of a PDA process, the substrate containing an oxide layer is heated to a temperature of about 600° C. for about 4 minutes within an oxygen atmosphere.

In one embodiment substrate 221 is transferred into the DPN chamber 214C, such as the CENTURA™ DPN chamber, available from Applied Materials, Inc., located in Santa Clara, Calif., where a Decoupled Plasma Nitridation process is performed. The plasma nitridation process exposes the high-K material 412 to nitrogen plasma and incorporates nitrogen into the high-K material 412 to form a nitrided high-k material. In one embodiment, the DPN chamber 214C is a reduced pressure inductively coupled RF plasma reactor that can accommodate an inert gas such as $N_2$, He, or Ar. Therefore, substrate 221 may be exposed to an inert plasma process without being exposed to the ambient environment. Gases that may be used in an inert plasma process include argon, helium, neon, xenon or combinations thereof.

The inert plasma process proceeds for a time period from about 10 seconds to about 5 minutes, preferably from about 30 seconds to about 4 minutes, and more preferably, from about 1 minute to about 3 minutes. Also, the inert plasma process is conducted at a plasma power setting within a range from about 500 watts to about 3,000 watts, preferably from about 700 watts to about 2,500 watts, and more preferably from about 900 watts to about 1,800 watts. Generally, the plasma process is conducted with a duty cycle of about 20% to about 100% and a pulse frequency at about 10 kHz. The DPN chamber may have a pressure within a range from about 10 mTorr to about 80 mTorr. The inert gas may have a flow rate within a range from about 10 standard cubic centimeters per minute (sccm) to about 5 standard liters per minute (slm), preferably from about 50 sccm to about 750 sccm, and more preferably from about 100 sccm to about 500 sccm.

In one embodiment, the substrate 221 is exposed to a thermal annealing process. In one embodiment, the substrate 221 is transferred to an annealing chamber 214D, such as the CENTURA™ RADIANCE™ RTP chamber available from Applied Materials, Inc., located in Santa Clara, Calif., and exposed to the thermal annealing process. Substrate 221 may be heated to a temperature within a range from about 600° C. to about 1,200° C., preferably from about 700° C. to about 1,150° C., and more preferably from about 800° C. to about 1,000° C. The thermal annealing process may last for a time period within a range from about 1 second to about 120 seconds, preferably, from about 2 seconds to about 60 seconds, and more preferably from about 5 seconds to about 30 seconds. Generally, the chamber atmosphere contains at least one annealing gas, such as oxygen ($O_2$), ozone ($O_3$), atomic oxygen (O), water ($H_2O$), nitric oxide (NO), nitrous oxide ($N_2O$), nitrogen dioxide ($NO_2$), dinitrogen pentoxide ($N_2O_5$), nitrogen ($N_2$), ammonia ($NH_3$), hydrazine ($N_2H_4$), derivatives thereof or combinations thereof. Often the annealing gas contains nitrogen and at least one oxygen-containing gas, such as oxygen. The chamber may have a pressure within a range from about 5 Torr to about 100 Torr, for example, about 10 Torr. In one example of a thermal annealing process, substrate 200 is heated to a temperature of about 1,050° C. for about 15 seconds within a nitrogen containing atmosphere with an extremely low amount of oxygen. In another example, substrate 200 is heated to a temperature of about 1,100° C. for about 25 seconds within an atmosphere containing equivalent volumetric amounts of nitrogen and oxygen. In another embodiment, substrate 200 is heated to a temperature of about 1,030° C. for about 30 seconds in a nitrogen atmosphere with a trace amount of oxygen.

The thermal annealing process repairs any damage caused by plasma bombardment during the DPN process and reduces the fixed charge of post anneal layer. The high-K material 412 may have a nitrogen concentration within a range from about 5 at % to about 25 at %, preferably from about 10 at % to about 20 at %, for example, about 15 at %. The high-K material 412 has a film thickness in a range from about 0.5 nm to about 30 nm, preferably from about 1 nm to about 10 nm, and more preferably from about 1 nm to about 8 nm.

At box 312, a second oxynitride layer 414 is deposited on the high-K dielectric layer 412. The second oxynitride layer 414 may be deposited using the same process conditions used to deposit the first oxynitride layer 410. The second oxynitride layer 414 is generally deposited with a film thickness in a range from about 0.5 nm to about 30 nm, preferably from about 1 nm to about 20 nm, and more preferably from about 3 nm to about 8 nm.

At box 314, a second polysilicon layer 416 is deposited on the second oxynitride layer 414. The second polysilicon layer 416 can be formed in a deposition chamber such as the LPCVD deposition chamber 214A or the ALD chamber 214B of the integrated processing system 200 (FIG. 2). Instead of polysilicon, a layer comprising either amorphous silicon or other suitable conductive material may be deposited on the second oxynitride layer 414. Further, metals such as titanium, titanium nitride, tantalum, tantalum nitride, tungsten, tungsten nitride, and other refractory metals or other suitable electrode materials may be deposited thereover. After the formation of the second polysilicon layer 416, the gate stack may be transferred to a cool down chamber and then transferred to a storage area such as the load locks 206A and 206B for further processing, testing, or other processes known in the art.

It is to be appreciated that the gate stack that includes the gate dielectric film and the polysilicon cap film can be formed in several processing chambers not necessarily incorporated into the integrated processing system 200 previously described.

Figure 5:
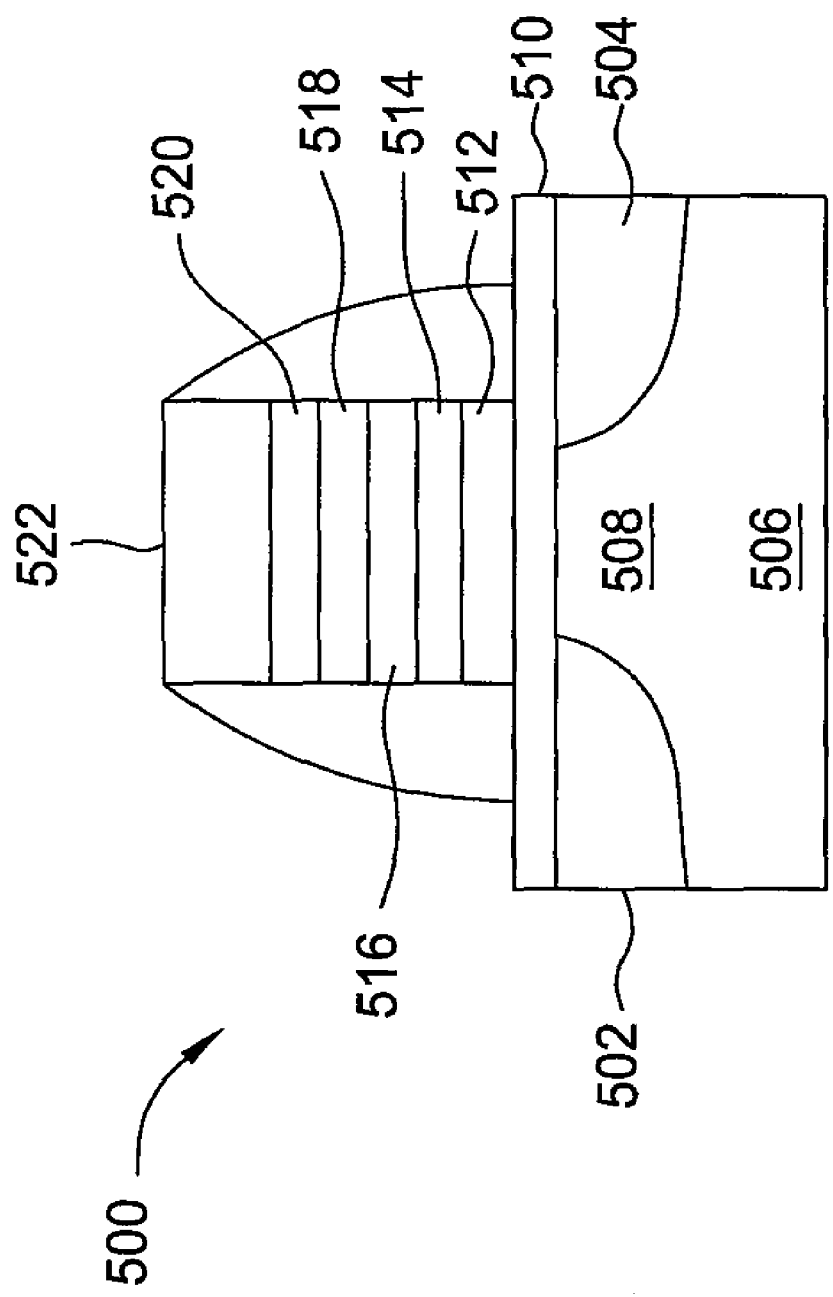
FIG. 5 depicts a two dimensional block diagram of one embodiment of a flash memory cell according to the present invention.

FIG. 5 depicts a two dimensional block diagram of one embodiment of a flash memory cell 500 according to the present invention. The flash memory cell 500 includes source/drain regions 502 and 504 located in a semiconductor substrate 506 and separated by a channel region 508. A first oxide layer 510, for example, a silicon dioxide layer, or tunnel dielectric overlies the channel region 508. A floating gate 512 or first polysilicon layer overlies the tunnel dielectric 510. In one embodiment, a second oxide layer 514 is located on the floating gate 512. A control gate 522 or second polysilicon layer overlies the floating gate 512 and is separated therefrom by an inter-poly dielectric comprising a first oxynitride layer 516 and a second oxynitride layer 520 formed on the semiconductor substrate 506 with a high-K dielectric layer 518 formed therebetween. In certain embodiments, the control gate 522 may comprise amorphous silicon or other suitable conductive material.

Thus, a structure and methods for forming a structure that allow for a reduction in device dimensions while also maintaining or reducing leakage current for non-volatile memory devices has been provided. The improved structure and method for forming a structure include an inter-poly dielectric comprising two silicon oxynitride layers with a high-k layer sandwiched therebetween.

While the foregoing is directed to embodiments of the present invention, other and further embodiments of the invention may be devised without departing from the basic scope thereof, and the scope thereof is determined by the claims that follow.

The invention claimed is:

1. A method of fabricating a non-volatile memory device, comprising:
    depositing a floating gate polysilicon layer on a substrate;
    forming a first silicon oxide layer on the floating gate polysilicon layer;
    depositing a first silicon oxynitride layer on the first silicon oxide layer, wherein depositing a first silicon oxynitride layer comprises:
        depositing a second silicon oxide layer;
        implanting nitrogen into the second silicon oxide layer during a plasma nitridation process; and
        heating the substrate to a temperature between 900° C. and 1,100° C. during a post nitridation annealing process;
    depositing a high-K dielectric layer on the first silicon oxynitride layer;
    depositing a second silicon oxynitride layer on the high-K dielectric layer; and
    forming a control gate polysilicon layer on the second silicon oxynitride layer.

2. The method of claim 1, wherein the first silicon oxide layer is formed by a rapid thermal oxidation process.

3. The method of claim 2, wherein the rapid thermal oxidation process comprises heating the substrate to a temperature between about 750° C. and 1,000° C. in the presence of a gas selected from $O_2$, $O_2+N_2$, $O_2+Ar$, $N_2O$, or $N_2O+N_2$ at a pressure between about 0.5-50 Torr.

4. The method of claim 1, wherein the first silicon oxide layer is between about 1 nm and about 2 nm thick.

5. The method of claim 1, wherein depositing the second silicon oxynitride layer comprises:
    depositing a third silicon oxide layer;
    implanting nitrogen into the third silicon oxide layer during a plasma nitridation process; and
    heating the substrate to a temperature between about 900° C. and about 1100° C. during a post nitridation annealing process.

6. The method of claim 5, wherein the nitrogen is implanted into the third silicon oxide material to a nitrogen concentration within a range of about 10 atomic % to about 20 atomic %.

7. The method of claim 1, wherein each of the first and second silicon oxynitride layers independently has a thickness within a range between about 3 nm and about 8 nm.

8. The method of claim 1, wherein the high-K dielectric layer comprises a material selected from the group comprising hafnium silicate, hafnium oxide, hafnium silicon oxynitride, aluminum oxide, zirconium oxide, combinations thereof, and alloys thereof.

9. The method of claim 8, wherein the high-K dielectric layer comprises hafnium silicon oxynitride.

10. The method of claim 1, wherein depositing a high-K dielectric layer on the first silicon oxynitride layer comprises:
    depositing a hafnium silicate layer over the first silicon oxynitride layer;
    implanting nitrogen into the hafnium silicate layer during a plasma nitridation process; and
    heating the substrate to a temperature within a range from about 600° C. to about 1000° C. during a post nitridation annealing process.

11. The method of claim 10, further comprising heating the substrate to a temperature within a range from about 600° C. to about 1000° C. after depositing the hafnium silicate layer and prior to implanting nitrogen into the hafnium silicate layer.

12. The method of claim 10, wherein the nitrogen is implanted into the hafnium silicate material to a nitrogen concentration within a range from about 10 atomic % and about 20 atomic %.

13. The method of claim 1, wherein the high-k dielectric layer has a thickness within a range between about 1 nm and about 8 nm.

14. A method of fabricating a non-volatile memory device, comprising:
    depositing a floating gate polysilicon layer on a substrate;
    depositing a first silicon oxide layer over the substrate;
    exposing the first silicon oxide layer to a nitridation process to form a first silicon oxynitride layer;
    exposing the substrate to a thermal annealing process;
    depositing a high-K dielectric material over the first silicon oxynitride layer;
    exposing the substrate to a post deposition annealing process;
    exposing the high-K dielectric material to a nitridation process to form a nitrided high-k dielectric material;
    exposing the nitrided high-K dielectric material to a post nitridation annealing process;
    depositing a second silicon oxide layer over the nitrided high-K dielectric material;
    exposing the substrate to a nitridation process to form a second silicon oxynitride layer; and
    exposing the substrate to a post nitridation annealing process.

15. The method of claim 14, further comprising depositing a control gate polysilicon layer on the second silicon oxynitride layer after exposing the substrate to a post nitridation annealing process.

16. The method of claim 14, wherein the nitrided high-K dielectric material comprises hafnium silicon oxynitride.

* * * * *

UNITED STATES PATENT AND TRADEMARK OFFICE
CERTIFICATE OF CORRECTION

| | |
|---|---|
| PATENT NO. | : 7,910,446 B2 |
| APPLICATION NO. | : 12/163542 |
| DATED | : March 22, 2011 |
| INVENTOR(S) | : Ma et al. |

It is certified that error appears in the above-identified patent and that said Letters Patent is hereby corrected as shown below:

In the References Cited (56):

Please delete "KR 102002006462 8/2002" and insert --KR 1020020064624 8/2002-- therefor;

In the Detailed Description:

Column 5, Line 57, please delete "Of" and insert --of-- therefor;

Column 11, Line 39, please delete "wafts" and insert --watts-- therefor.

Signed and Sealed this
Twenty-fourth Day of May, 2011

David J. Kappos
*Director of the United States Patent and Trademark Office*